United States Patent
Bolas et al.

(10) Patent No.: US 7,003,344 B2
(45) Date of Patent: Feb. 21, 2006

(54) INSTALLATION FOR SCANNING A LEG OR OTHER LIMB OF AN ANIMAL WITH A MAGNETIC RESONANCE IMAGING APPARATUS

(75) Inventors: Nicholas Martin Bolas, Kent (GB); Richard Hockley, Surrey (GB); Paul Michael Kurn, Surrey (GB)

(73) Assignee: Hallmarq Veterinary Imaging Ltd. (GB)

( * ) Notice: Subject to any disclaimer, the term of this patent is extended or adjusted under 35 U.S.C. 154(b) by 86 days.

(21) Appl. No.: 10/499,485

(22) PCT Filed: Dec. 18, 2002

(86) PCT No.: PCT/GB02/05752

§ 371 (c)(1),
(2), (4) Date: Jun. 17, 2004

(87) PCT Pub. No.: WO03/052441

PCT Pub. Date: Jun. 26, 2003

(65) Prior Publication Data

US 2005/0088178 A1 Apr. 28, 2005

(30) Foreign Application Priority Data

Dec. 18, 2001 (GB) .............................................. 0130148

(51) Int. Cl.
*A61B 5/05* (2006.01)

(52) U.S. Cl. ..................... 600/410; 600/415; 324/318

(58) Field of Classification Search .......... 600/410–423; 324/318–320
See application file for complete search history.

(56) References Cited

U.S. PATENT DOCUMENTS

| 5,623,241 A | 4/1997 | Minkoff | |
| 6,567,683 B1 * | 5/2003 | Knuettel | ................... 600/410 |

FOREIGN PATENT DOCUMENTS

| GB | 2 355 306 A | 4/2001 |
| JP | 02036842 A | 6/1999 |

* cited by examiner

*Primary Examiner*—Ramon M. Barrera
(74) *Attorney, Agent, or Firm*—Wegman, Hessler & Vanderburg

(57) ABSTRACT

An installation for enabling the scanning of a leg (5) of a horse (8) with a magnetic resonance imaging (MRI) device comprises a floor section (90) on which the horse (8) stands with the leg to be scanned. The floor section (90) is mounted above a support surface (10) for the MRI device and includes at least one floor member which is moveable to expose an opening for accommodating a magnetic scanning element (1) adjacent the leg. The floor section (90) may have three moveable floor members and either pair of adjacent floor members may be moveable to expose a pair of slots or openings for accommodating the magnetic scanning element (1) on opposite sides of the leg supported on the floor section (90) between the pair of openings.

10 Claims, 4 Drawing Sheets

Figure 1:
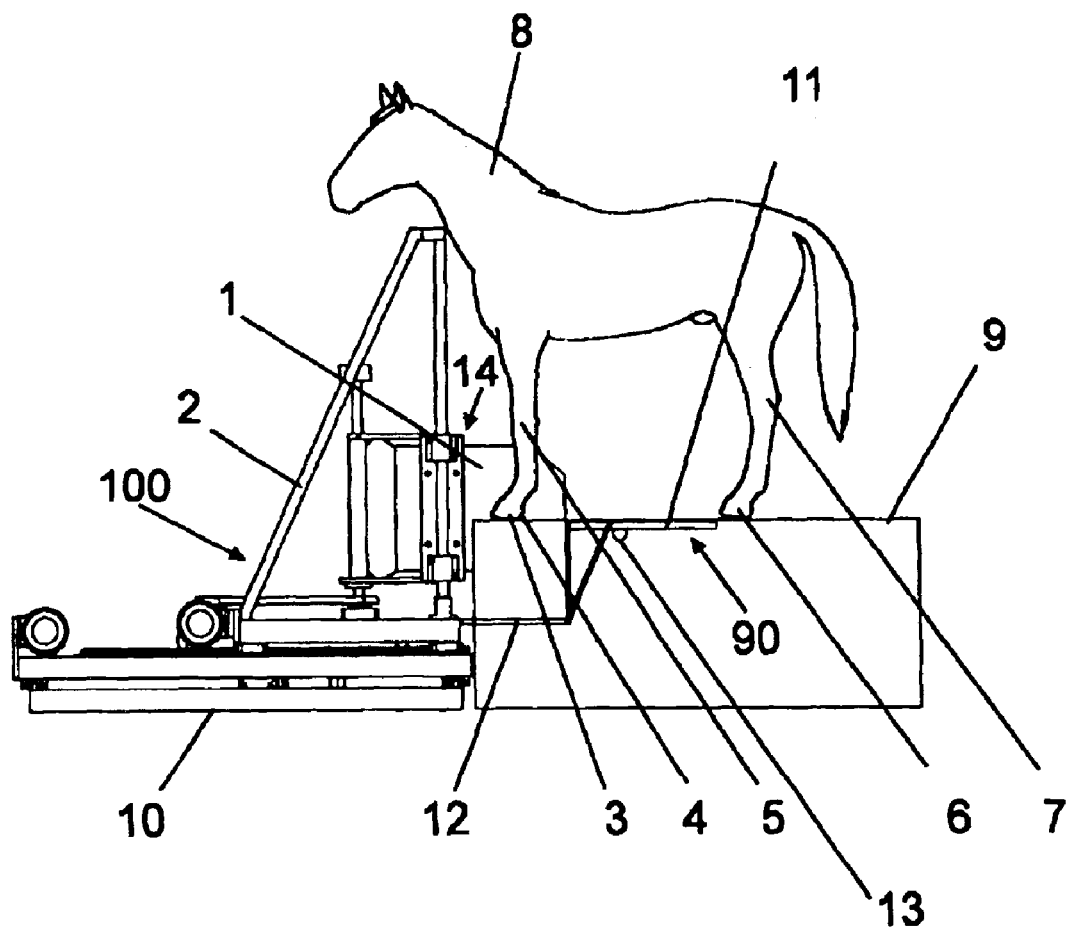

INSTALLATION FOR SCANNING A LEG OR OTHER LIMB OF AN ANIMAL WITH A MAGNETIC RESONANCE IMAGING APPARATUS

CROSS-REFERENCE TO RELATED APPLICATIONS

This application claims the priority filing benefit of International PCT Application PCT/GB02/05752 filed Dec. 18, 2002, and published under PCT 21(2) in the English language and Great Britain Patent Application 0130148.0 filed Dec. 18, 2001.

The present invention relates to an installation for use with scanning apparatus and, more particularly, to an installation for enabling the scanning of a limb of an animal with a magnetic resonance imaging (MRI) device.

Known MRI devices for human clinical imaging utilise a large superconducting magnet and a cylindrical tunnel within a larger concentric cylindrical device. In order to scan an item with such an MRI device, the item has to be placed close to the centre of the cylinder.

Such MRI devices are, in general, unsuitable for imaging equines or similar large animals. In order to position the animal, or part of the animal, at the central imaging position of the device so that it can be scanned, the animal must be lying down and stationary which requires the animal to be anaesthetised. Furthermore, the distance from the edge of the MRI device to the central imaging volume is sufficiently large that it is only possible to image the extremities of the limb. Another problem is that building the device sufficiently large to accommodate the entire animal is uneconomical.

Other known MRI devices include two flat or approximately flat magnetic plates with a gap therebetween and a structure which holds the plates in place and which provides for the magnetic properties of the device. Images of an item are obtained by placing the item in the centre of the gap and then scanning it with the MRI device. Known MRI devices of this type can be built to a sufficient size to accommodate an entire human patient or to a smaller size for imaging human limbs. Such smaller size MRI devices have also been proposed for imaging equine limbs.

In order to scan a human patient with an MRI device, the patient has to position themselves in a specific location and remain still for the duration of the examination. The human patient positions a part of the body, such as a knee or elbow, which is not the extremity of the limb, into the central imaging volume of a magnet of suitable size. The limb can be arranged in such a way that the support need not be weight bearing. For example, one approach is to sit a patient close to the magnet and to support the patient's limb using light materials, such as foam plastic. Another approach is to support the limb using devices made temporarily from wooden blocks or other suitable materials.

However, for veterinary applications such patient co-operation cannot be achieved. The veterinary subjects cannot be asked to co-operate and therefore alternative methods to those used on human patients must be used for locating the body part of interest into the imaging volume of the MRI device. As with the majority of other known veterinary devices, the subject must be anaesthetised so that it can be examined using the MRI device. In the case of large animals, including equines, anaesthesia and the subsequent recovery from anaesthesia carries a significant risk of mortality.

It is an object of the present invention to provide an installation or structure for enabling scanning of an animal with an MRI device which mitigates the aforementioned problems.

Accordingly, the present invention consists in an installation for enabling the scanning of a leg or other limb of an animal with a magnetic resonance imaging (MRI) device, comprising a floor section on which the animal stands with the limb to be scanned, characterized in that said floor section is mountable above a support surface for the MRI device and includes at least one floor member moveable in order to expose an opening for accommodating a magnetic scanning element of the MRI device adjacent the limb to be scanned.

By moving the floor member(s) in order to expose the opening(s), the magnetic scanning element of the MRI device can be accommodated in the opening(s) adjacent the limb to be scanned whilst the animal is standing. A principle advantage of the invention is that the leg can be scanned with the MRI device without anaesthetising the animal.

Conveniently, the floor section has a free edge for positioning adjacent the MRI device and the or each floor member is movable towards and away from the free edge of the floor section to expose a slot or opening communicating with the free edge. The floor member(s) may be movable in response to movement of the MRI device towards and away from an operative position. The magnetic scanning element can therefore easily be accommodated in the opening(s) by moving the MRI device towards the free edge of the floor section.

Preferably, the or each floor member is slideably mounted in the floor section.

The floor section may include two floor members moveable to expose two spaced slots or openings for accommodating the magnetic scanning element adjacent the limb supported on the floor section between the openings.

In the preferred embodiment, the floor section includes three floor members movable to expose three individual slots or openings. The magnetic scanning element may be accommodated in either pair of adjacent exposed openings on opposite sides of a limb supported on the floor section between the respective pair of openings.

The floor section may include biasing means, such as spring means, for restoring the moveable floor member(s) to the position in which the slot or openings are closed in response to movement of the MRI device away from the floor section.

The installation may include a trolley or carriage for manoeuvring at least the magnetic scanning element of the MRI device into and out of the slot(s) and towards and away from the floor section. The trolley or carriage may include means for moving at least the magnetic scanning element of the MRI device in the horizontal and vertical plane.

In the preferred embodiment, the trolley or carriage includes means for moving the magnetic scanning element along three substantially orthogonal axes. The means for moving the magnetic scanning element of the MRI device may include electric motors or hydraulics.

The floor section and movable members are made from substantially non-magnetic material so that the magnetic field at the imaging location is not disturbed when the floor section is moved.

Figure 2:
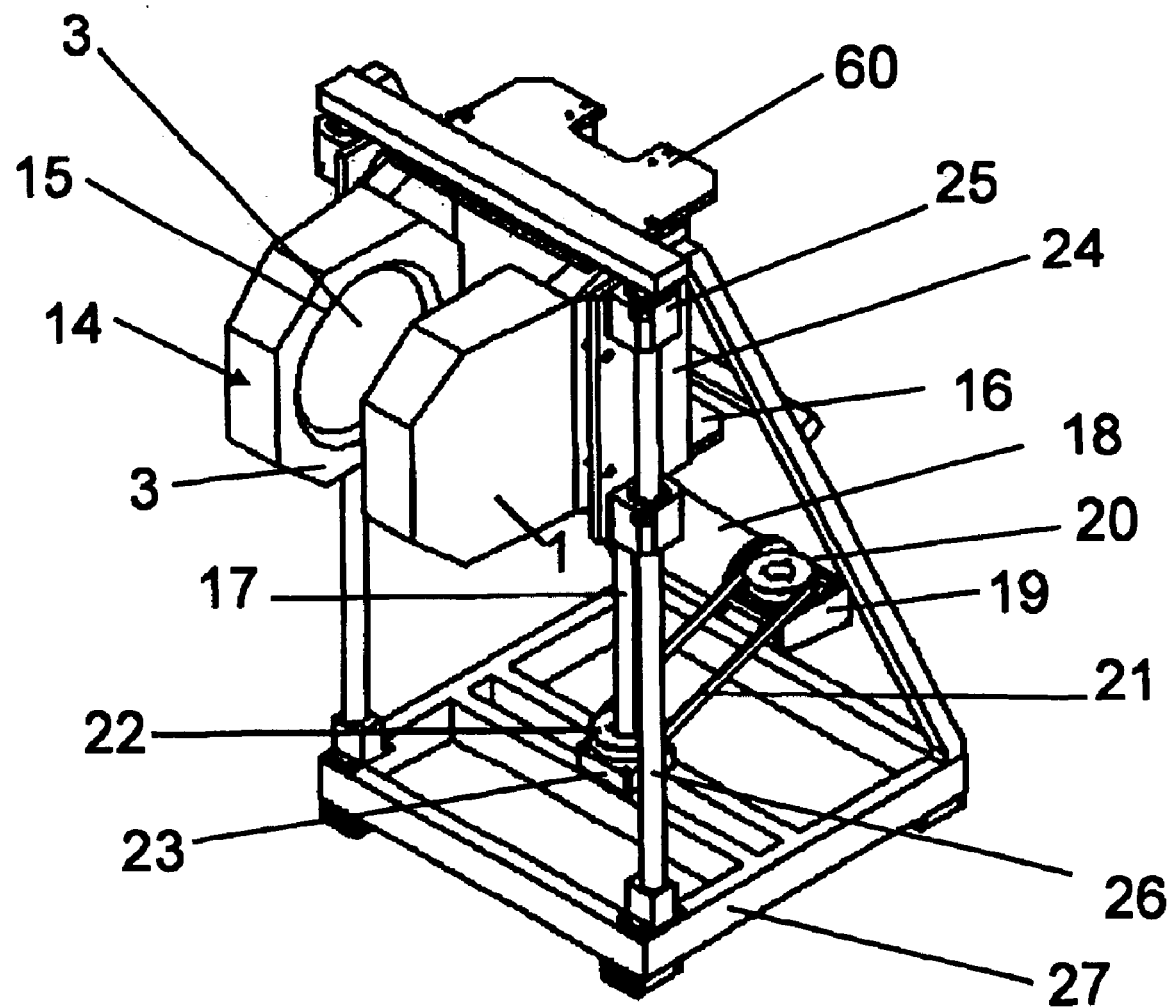
Figure 3:
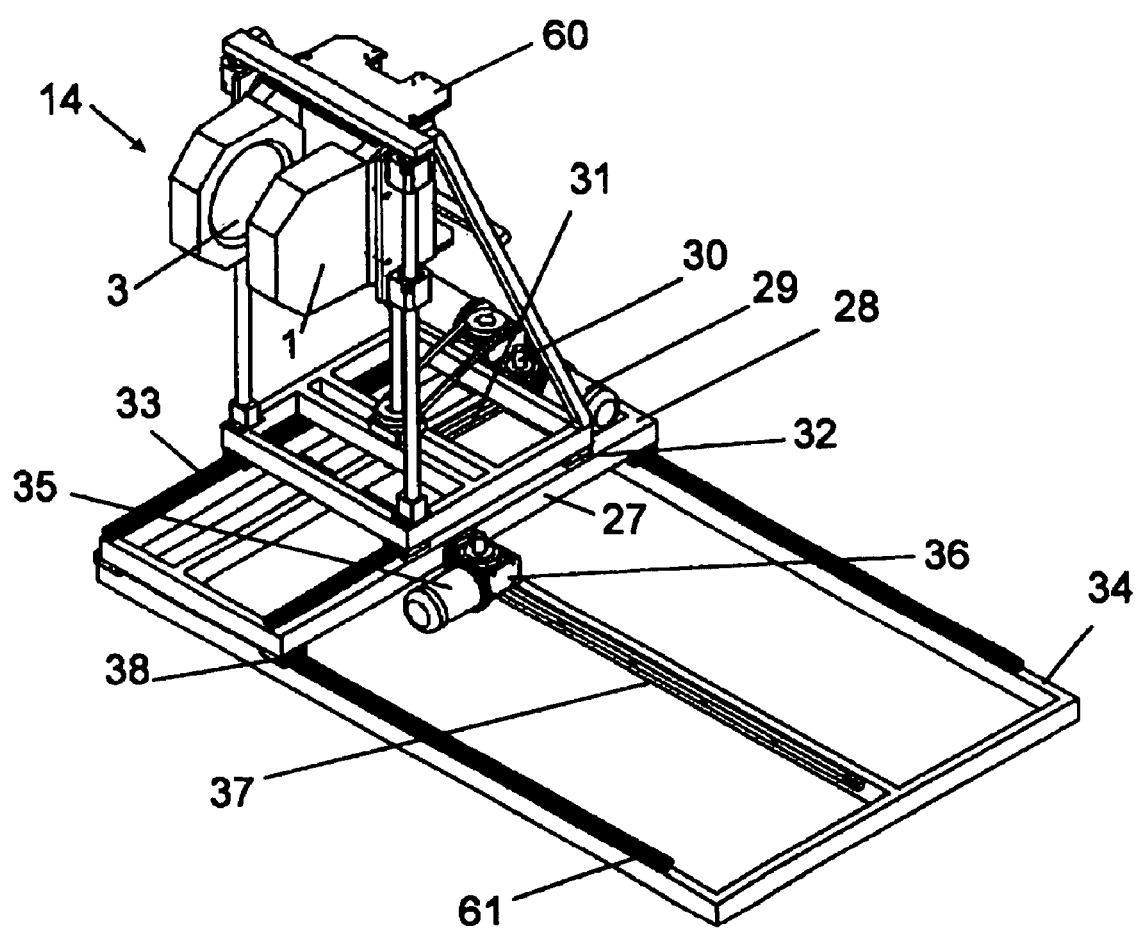
Figure 4:
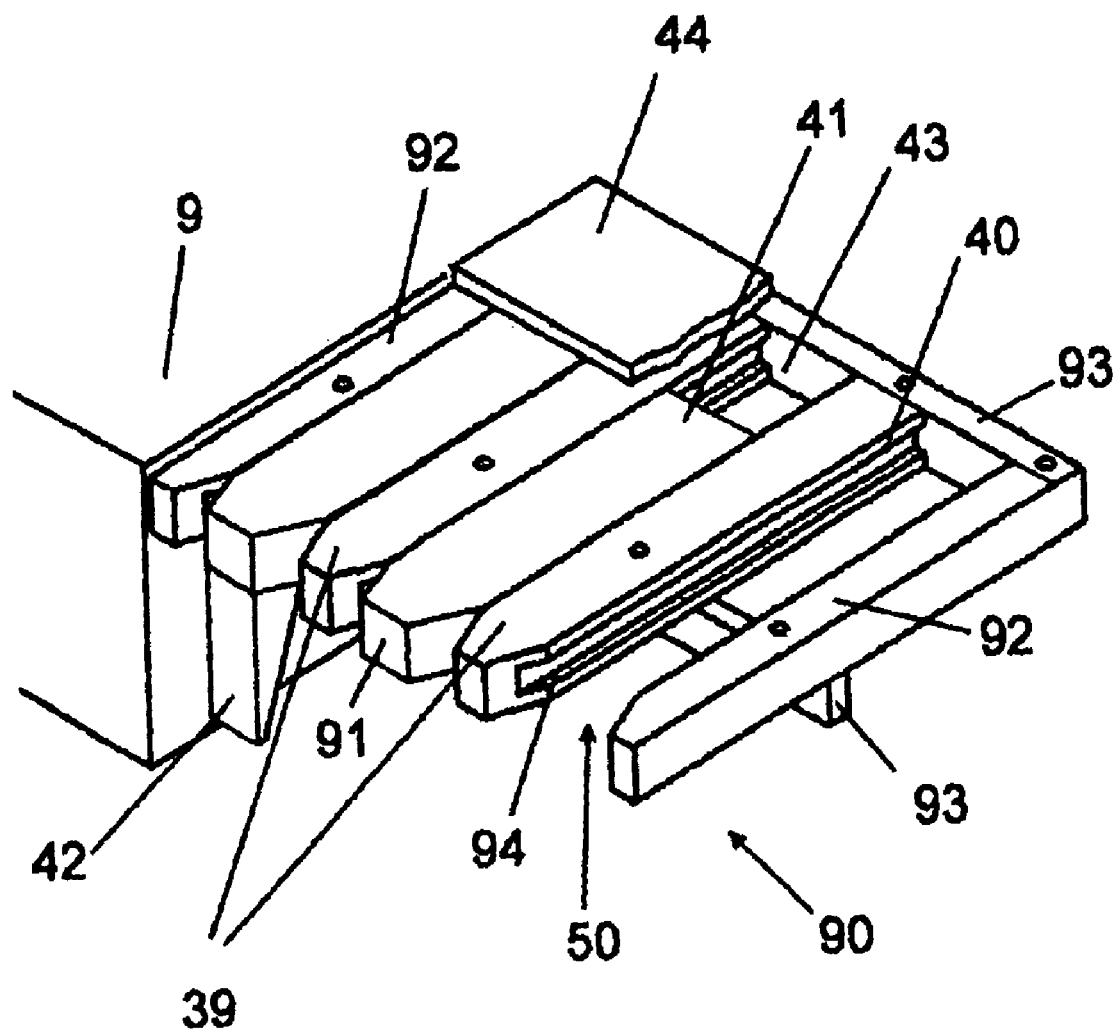

An embodiment of the present invention will now be described, by way of example, with reference to the accompanying drawings, in which:

FIG. 1 shows a side view of an installation according to the present invention with the magnetic scanning element of the MRI magnet device positioned about the lower fore leg of a horse, FIG. 2 shows a perspective view of the MRI magnet system and its mounting carriage of the MRI device shown in FIG. 1, FIG. 3 shows a perspective view of the mounting carriage and its supporting rails or tracks, and FIG. 4 shows a fragmentary perspective view of the floor section of the installation shown in FIG. 1.

Referring to FIG. 1 of the accompanying drawings, the installation enables a leg of a horse 8 to be scanned with an MRI device. It includes a floor section 90 on which the horse 8 stands with its leg to be scanned. This floor section is mounted above the floor 10 supporting the MRI magnet system 14 of the MRI device, for example, at the front edge of a platform 9. Alternatively, the supporting floor 10 for the magnet system may be the floor of a well constructed adjacent the floor section 90.

As best shown in FIG. 4, the floor section 90 comprises a framework which is built into a recess provided in the front edge of the platform 9. The framework includes a U-shaped frame comprising two mutually parallel members 92 fixed to the opposite ends of a lateral member 93. The open end of the frame is aligned with the front of the platform 9.

Two fixed floor members 39 are mounted on the frame in parallel with and between the members 92 to define three parallel slots or openings 50. A support beam 93 is attached to the underside of the members 39, 92 to reinforce the framework and provide support for slidable floor members 41.

The three rectangular floor members 41 are slideably mounted along mutually parallel guideways formed in the fixed members 39, 92 along opposite sides of the slots or openings 50. In FIG. 4, one floor member 41 has been removed to show the guideways 40. Each slidable floor member 41 has a downwardly projecting abutment 42 at its front end (only one shown in FIG. 4).

Slidable floor members 41 are shorter than the slots 50 so that a gap 43 exists between the floor members and the frame member 93 when the free ends of the floor members 41 are aligned with the front of the floor section 90. The gaps 43 are of a sufficient length to permit the floor members 41 to slide inwardly from the free edge 91 of the floor section 90 into the gaps 43 so as to expose the slots or openings 50 for accommodating the magnetic scanning element. The gaps 43 are concealed by a plate 44, only part of which is shown in FIG. 4 for clarity.

The free ends of the fixed members 39, 92 taper inwardly so as to provide a lead-in for the magnetic scanning element and so that it easily moves into the slots 50 when exposed.

Mounted on the supporting floor 10 is a trolley or carriage 100 for manoeuvring the MRI magnetic system 14 towards and away from the free edge 91 of the platform. Mounted on the carriage 100 are two rods 12 which project towards the floor section 90. These rods are positioned to make contact with and push the abutments 42 of two adjacent slidable floor members 41, and hence the slidable floor members, away from the front of the floor section 90 when the carriage 100 is moved towards the floor section (see FIGS. 1 and 4).

A biasing means (not shown), such as a spring, provides return force for restoring the floor members to the position in which they can conceal their associated slots 50 in response to movement of the carriage and rods 12 away from the floor section 90.

The floor section 90, floor members 41 and biasing means are manufactured from non-magnetic material to avoid distortion of the magnetic field of the MRI imaging system.

In this embodiment, the fixed members 39, 92 are made from wood, the moveable floor members 41 are made from aluminium and plastic and the biasing means comprises a stainless steel spring.

In order more adequately to explain the present invention, an MRI device which can be used in conjunction with the present invention will now be described.

The first main component of the MRI device is a "C" or "U" shaped permanent magnet 1 consisting of magnetised material in which the magnetic field at a location between the two arms of the magnet is of sufficient strength and homogeneity to satisfy the requirements of magnetic resonance imaging. Each arm has an inner face on which is mounted an array of electrical coils, known in the art as "gradient" coils, through which electrical currents are passed in order to modulate the magnetic field, as in the conventional manner for MRI devices. Thermal insulation material and a protector cover surround the entire arrangement of magnet and coils. The gap 3 between the two arms is sufficient to accommodate the widest part of the limb of interest, which in this embodiment is the leg of a horse. Immediately surrounding the limb is a further array of one or more electrical coils, known in the art as "RF" coils, to which radio frequency signals are transmitted and received in the execution of the imaging study. This entire sub-system of magnet, coils, heaters and insulation are collectively referred to as the "MRI magnet system".

The second main component is electronic equipment, consisting of a computer, dedicated single generation and detection devices and power amplifiers, which are collectively known as "the spectrometer". The spectrometer is connected to the MRI magnet system by a number of electrical cables, and is located at a convenient position approximately two to ten meters from the MRI magnet system. For the purpose of clarity, the coils of the magnetic system and electronic equipment of the MRI device are not shown in the Figures.

FIG. 2 shows the carriage 100 for manoeuvring the MRI magnet system 14 up and down in the vertical plane and towards and away from the floor section 90. The carriage 100 includes a frame 60 in which the permanent magnet 1 of the MRI magnet system 14 is mounted by means of threaded mounting hole in the frame (not shown). The frame 60 is slideable on linear bearings 25 mounted on vertical guidebars fixed to the front corners of the base frame 27.

The MRI magnet system 14 is supported by means of a lower plate 16 which is moveable up and down by means of a drive screw 17 mounted on the base frame 27. A thrust nut (not shown) mounted in the lower plate 16 secures the lower plate to the drive screw which is turned by means of an electric motor 18, gearbox 19, pulley 20, drive belt 21 and pulley 22 all of which are mounted on the base frame 27.

The total range of vertical movement is, for example, 70 cm or more to allow a range of examinations from the foot to the hock of a large horse.

The carriage 100 is slideable towards and away from free edge 91 of the floor section on linear bearings 32 mounted on two parallel tracks or rails 33 which extend longitudinally of the installation. The rails 33 are mounted on a sub-carriage comprising a rectangular frame 28.

Attached to the base frame 27 of the carriage 100 are a motor 29 and gearbox 30 which drive a tooth pinion (not shown) which engages in a tooth rack 31 mounted on the frame 28 of the sub-carriage to move the carriage 100 along the rails 33.

The range of movement in the forward/back direction is, for example, 50 cm or more; such range of movement allows the MRI magnet system 14 to be completely removed from the vicinity of the horse's leg before and after examination, to be positioned such that the volume of interest is in the centre gap 3 of the magnet 1 during the examination, and to be removed and relocated for examination of either the left or right leg without moving the horse 8.

The sub-carriage is slideable sideways on linear bearings 38 mounted on two parallel rails 61 which extend transversely of the installation. The rails are fixed to a rectangular mounting frame 34 which seats on the supporting floor 10. A motor 35 and gearbox 36 are mounted on the side of the rectangular frame 28 and drive a tooth pinion (not shown) which engages a tooth rack 37 which is fixed to the frame 34. The range of sideways travel is, for example, 50 cm or more to allow the MRI magnetic system to be positioned around either the left or right leg without moving the horse 8.

The carriage 100 allows the MRI magnet system 14 to be moved vertically to position the imaging volume, that is, the centre of the gap 3 between the two poles of the magnet 1, around any part of the lower forelimb from the foot 4 to the carpus (knee) 5 or any part of the lower hind limb from the foot 6 to the tarsus (hock) 7. Furthermore, the carriage allows the MRI magnet system 14 to be moved laterally to position the imaging volume around the left or right limb as well as forward and backward to aid positioning of the horse 8.

The magnet 1 incorporates a location 15 for an array of electrical coils (not shown) which allow the magnet field to be modulated in a known manner for magnetic resonance imaging such that an image is obtainable from a sample placed in the imaging volume at the centre gap 3 of the magnet 1.

Electrical cables connecting the MRI magnet system 14 to the spectrometer are mounted at convenient points on the framework.

The electric motors 18, 29, 35 are controlled by a control system which may be operated by the operator of the MRI device using a hand held panel with control buttons or other suitable means. Electrical circuit switches are positioned on the frames 27, 28, 34 so as to trigger in response to the magnet 14, frame 27 or 28 moving the furthest permissible distance from their nominal centre positions. The limit switches are electrically connected to the control system which is adapted to stop the motors 18, 29, 35 in response to the limit switches triggering so as to prevent damage due to movement of the magnet 14, frame 27 or 28 and other components beyond the design limits.

An electrical signal from the spectrometer is connected to the control system to disable the motors 18, 29, 35 and motor drive electronics during the acquisition of an MRI image to prevent electrical noise generated by the motor controllers from degrading the equality of the MRI image.

In this embodiment, wooden stocks (not shown), of a type conventionally used in veterinary practice for animal examinations, are positioned around the floor surface 9 and floor section 90 to loosely constrain the animal during the examination. A wooden bar (not shown) at the front of the stock prevents the animal walking forward and falling onto the trolley.

Components which are fixed in relation to the magnet 1, for example the lower plate 16, plates 24 and linear bearings 25, may be manufactured from magnetic material. However, in this embodiment, the components are non-magnetic. Components which move in relation to the magnet are made of non-magnetic material wherever possible, including fixtures and fittings. Where it is not possible to use non-magnetic components, for example the electric motors 18, 29, 35, such components are located at a sufficient distance from the magnet 1 so that they do not cause a significant change in the magnetic field homogeneity within the imaging volume 3 when the magnet 1 is moved. In this embodiment, for example, the magnetic components are more than 50 cm from the closest part of the magnet 1 when the magnet 1 is at its closest position to the magnetic components so as not to cause such a change in the magnetic field homogeneity.

The installation operates as follows. Prior to examination, the carriage 100 is removed away from the platform 9 and the horse 8 is free to stand on the platform including the entire floor section 90. The horse 8 is then positioned so that it is standing with its front left and right legs respectively placed on the two fixed floor members 39.

Using the carriage 100, the MRI magnet system 14 is manoeuvred towards the floor section 90. The two rods 12 mounted on the carriage 100 engage with the abutments 42 of the two of the floor members 41 which are directly either side of the fixed floor member on which the left leg is placed.

As the MRI magnet system approaches the floor section 90, the rods 12 push the two floor members 41 against the force of the biasing means away from the front edge 91 and into the gaps 43 in order to expose the slots 50 for accommodating the two arms of the magnet 1 of the MRI system 14. At the same time, the arms of the magnet 1 are advanced into the exposed slots 50 such that the left leg is in the gap 3 of the magnet 1.

By moving the floor members 41 to expose the slots 50, the arms of the magnet 1 can be accommodated in the exposed slots 50 adjacent the leg whilst the horse 8 is standing still. The leg of the horse 8 can therefore be scanned with the MRI device without having to anaesthetise the horse.

Once scanning has been completed, the magnet 1 is withdrawn from the slots 50 using the trolley 100. As the magnet 1 is removed, the floor members 41 are urged back towards the front edge 91 of the floor section 90 under the force of the biasing means.

Then, without moving the horse, the magnet 1 is manoeuvred towards the floor section 90 so that the rods 12 push the two slideable floor members 41 to expose the slots 50 directly either side of the right leg. At the same time, the arms of the magnet 1 are advanced into the exposed slots 50 such that the right leg is in the gap 3 of the magnet 1. Once scanning has been completed, the arms of the magnet 1 are withdrawn from the slots 50 by rearward movement of the carriage 100 and the slideable floor members 41 are restored to their initial positions by the biasing means to cover the slots 50.

The installation of this embodiment is advantageous in that it enables both front legs of the horse 8 to be scanned with the MRI device without moving the horse 8.

When the MRI magnet system is moved away from the floor section 90, the horse 8 is free to move and can stand on the slideable floor members 41 as well as the rest of the floor section 90.

It is not intended that the present invention be restricted to the electrical and mechanical components illustrated and described herein. Particularly, it would be obvious to a skilled man in the art that the present invention may be applied using a single slot or opening for accommodating a magnetic scanning element and/or using other MRI systems which use a magnetic scanning element of different shape, such as a cylinder. It is also recognised that those skilled in the art would be capable of using the installation for enabling the scanning with the MRI device of animals other than horses and limbs other than legs without departing from the scope of the present invention.

What is claimed is:

1. An installation for enabling the scanning of a leg or other limb (4, 5) of an animal (8) with a magnetic resonance imaging (MRI) device, comprising a floor section (90) on which the animal (8) stands with the limb (4, 5) to be scanned, characterized in that said floor section (90) is mountable above a support surface (10) for the MRI device and includes at least one floor member (41) moveable in order to expose an opening (50) for accommodating a magnetic scanning element (1) of the MRI device adjacent the limb to be scanned.

2. An installation as claimed in claim 1, wherein the floor section (90) has a free edge (91) for positioning adjacent the MRI device and the floor member (41) is moveable towards and away from the free edge (91) of the floor section.

3. An installation as claimed in claim 1, wherein the floor member (41) is slideable.

4. An installation as claimed in claim 1, wherein the floor member (41) is moveable in response to movement of the MRI device towards and away from the floor section (90).

5. An installation as claimed in claim 1, wherein the floor section (90) includes two floor members (41) moveable to expose two spaced openings or slots (50) for accommodating the magnetic scanning element (1) on opposite sides of the a limb (4, 5) which is supported on the floor section between the two openings or slots (50).

6. An installation as claimed in claim 1, wherein the floor section (90) includes three floor members (41) moveable to expose three spaced openings or slots (50), and wherein either pair of adjacent floor members is moveable to expose a pair of openings or slots (50) for accommodating the magnetic scanning element (1) on opposite sides of a limb supported on the floor section between the respective pair of openings or slots (50).

7. An installation as claimed in claim 1, including a biasing means for restoring the moveable floor member (41) to the position in which the slot or opening (50) is closed in response to movement of the MRI device away from the floor section.

8. An installation as claimed in claim 1, including a trolley or carriage (100) for manoeuvring the magnetic scanning element (1) of the MRI device into and out of the slot(s) or opening(s) (50) and towards and away from the floor section (90).

9. An installation as claimed in claim 8, wherein the trolley or carriage (100) includes means for moving the magnetic scanning element (1) of the MRI device in the horizontal and vertical plane.

10. An installation as claimed in claim 9, wherein the magnetic scanning element (1) is moveable along three substantially orthogonal axes.

* * * * *